(12) United States Patent
Cheng et al.

(10) Patent No.: US 9,748,114 B2
(45) Date of Patent: Aug. 29, 2017

(54) METHOD FOR FORMING THROUGH SILICON VIA IN N+ EPITAXY WAFERS WITH REDUCED PARASITIC CAPACITANCE

(71) Applicant: International Business Machines Corporation, Armonk, NY (US)

(72) Inventors: Kangguo Cheng, Guilderland, NY (US); Subramanian S. Iyer, Mount Kisco, NY (US); Pranita Kerber, Slingerlands, NY (US); Ali Khakifirooz, Slingerlands, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/632,531

(22) Filed: Feb. 26, 2015

(65) Prior Publication Data

US 2015/0179548 A1 Jun. 25, 2015

Related U.S. Application Data

(62) Division of application No. 13/743,882, filed on Jan. 17, 2013, now Pat. No. 9,029,988, which is a division
(Continued)

(51) Int. Cl.
*H01L 21/44* (2006.01)
*H01L 21/48* (2006.01)
(Continued)

(52) U.S. Cl.
CPC .......... *H01L 21/486* (2013.01); *H01L 21/266* (2013.01); *H01L 21/268* (2013.01);
(Continued)

(58) Field of Classification Search
CPC ......... H01L 21/26586; H01L 21/76877; H01L 21/486; H01L 23/481; H01L 21/324;
(Continued)

(56) References Cited

U.S. PATENT DOCUMENTS 5,915,167 A 6/1999 Leedy
5,976,960 A 11/1999 Cheffings
(Continued)

FOREIGN PATENT DOCUMENTS

CN 1155050 C 6/2004
CN 1525485 9/2004
(Continued)

OTHER PUBLICATIONS

Van der Plas, G., et al., "Design Issues and Considerations for Low-Cost 3D TSV IC Technology," ISSCC 2010, pp. 148-149.
(Continued)

*Primary Examiner* — Shouxiang Hu
(74) *Attorney, Agent, or Firm* — Cantor Colburn LLP; Steven Meyers (57) ABSTRACT

A semiconductor device includes an epitaxy layer formed on semiconductor substrate, a device layer formed on the epitaxy layer, a trench formed within the semiconductor substrate and including a dielectric layer forming a liner within the trench and a conductive core forming a through-silicon via conductor, and a deep trench isolation structure formed within the substrate and surrounding the through-silicon via conductor. A region of the epitaxy layer formed between the through-silicon via conductor and the deep trench isolation structure is electrically isolated from any signals applied to the semiconductor device, thereby decreasing parasitic capacitance.

10 Claims, 11 Drawing Sheets

Related U.S. Application Data of application No. 12/894,218, filed on Sep. 30, 2010, now abandoned.

(51) Int. Cl.

| | | |
|---|---|---|
| *H01L 21/768* | (2006.01) | |
| *H01L 23/48* | (2006.01) | |
| *H01L 23/538* | (2006.01) | |
| *H01L 21/265* | (2006.01) | |
| *H01L 21/266* | (2006.01) | |
| *H01L 21/268* | (2006.01) | |
| *H01L 21/324* | (2006.01) | |
| *H01L 29/36* | (2006.01) | |

(52) U.S. Cl.
CPC ...... *H01L 21/26586* (2013.01); *H01L 21/324* (2013.01); *H01L 21/76802* (2013.01); *H01L 21/76831* (2013.01); *H01L 21/76877* (2013.01); *H01L 21/76898* (2013.01); *H01L 23/481* (2013.01); *H01L 23/5384* (2013.01); *H01L 29/36* (2013.01); *H01L 2924/0002* (2013.01)

(58) Field of Classification Search
CPC . H01L 21/76898; H01L 29/36; H01L 21/268; H01L 21/76802; H01L 21/266; H01L 21/76831; H01L 23/5384; H01L 2924/0002; H01L 23/5226; H01L 23/66; H01L 23/49827; H01L 23/49822; H01L 23/5286
USPC .......................................... 438/667, 675, 514
See application file for complete search history.

(56) References Cited

U.S. PATENT DOCUMENTS

| | | | |
|---|---|---|---|
| 6,133,640 | A | 10/2000 | Leedy |
| 6,208,545 | B1 | 3/2001 | Leedy |
| 6,509,240 | B2 | 1/2003 | Ren et al. |
| 6,551,857 | B2 | 4/2003 | Leedy |
| 6,563,224 | B2 | 5/2003 | Leedy |
| 6,632,706 | B1 | 10/2003 | Leedy |
| 7,138,295 | B2 | 11/2006 | Leedy |
| 7,193,239 | B2 | 3/2007 | Leedy |
| 7,253,477 | B2 | 8/2007 | Loechelt et al. |
| 7,474,004 | B2 | 1/2009 | Leedy |
| 7,504,732 | B2 | 3/2009 | Leedy |
| 7,633,165 | B2 | 12/2009 | Hsu et al. |
| 7,679,146 | B2 | 3/2010 | Tu et al. |
| 7,701,057 | B1 | 4/2010 | Rahman et al. |
| 7,705,466 | B2 | 4/2010 | Leedy |
| 7,871,925 | B2 | 1/2011 | Kim et al. |
| 8,110,900 | B2 | 2/2012 | Yoshimura et al. |
| 8,502,338 | B2 * | 8/2013 | Yen ................... H01L 21/76898 257/503 |
| 2002/0132465 | A1 | 9/2002 | Leedy |
| 2003/0173608 | A1 | 9/2003 | Leedy |
| 2005/0199980 | A1 | 9/2005 | Fujimaki |
| 2009/0067210 | A1 | 3/2009 | Leedy |
| 2009/0174082 | A1 | 7/2009 | Leedy |
| 2009/0175104 | A1 | 7/2009 | Leedy |
| 2009/0218700 | A1 | 9/2009 | Leedy |
| 2009/0219742 | A1 | 9/2009 | Leedy |
| 2009/0219743 | A1 | 9/2009 | Leedy |
| 2009/0219744 | A1 | 9/2009 | Leedy |
| 2009/0219772 | A1 | 9/2009 | Leedy |
| 2009/0230501 | A1 | 9/2009 | Leedy |
| 2009/0278238 | A1 | 11/2009 | Bonifield et al. |
| 2009/0321948 | A1 | 12/2009 | Wang et al. |
| 2010/0032764 | A1 | 2/2010 | Andry et al. |
| 2010/0171224 | A1 | 7/2010 | Leedy |
| 2010/0171225 | A1 | 7/2010 | Leedy |
| 2010/0172197 | A1 | 7/2010 | Leedy |
| 2010/0173453 | A1 | 7/2010 | Leedy |
| 2010/0224965 | A1 | 9/2010 | Kuo et al. |

FOREIGN PATENT DOCUMENTS

| | | |
|---|---|---|
| CN | 101188235 B | 10/2010 |
| EP | 0975472 A1 | 4/1998 |
| EP | 1986233 A2 | 10/2008 |
| JP | 2002516033 | 5/2002 |
| JP | 2008028407 A | 2/2008 |
| JP | 2008166831 a | 7/2008 |
| JP | 2008166832 A | 7/2008 |
| JP | 2008172254 A | 7/2008 |
| KR | 100639752 | 10/2006 |
| KR | 100785821 | 12/2007 |
| TW | 412854 | 11/2000 |

OTHER PUBLICATIONS

Van Olmen, J., et al., "3D Stacked IC Demonstration using a Through Silicon via First Approach," IEDM, 2008, pp. 1-4.

* cited by examiner

METHOD FOR FORMING THROUGH SILICON VIA IN N+ EPITAXY WAFERS WITH REDUCED PARASITIC CAPACITANCE

DOMESTIC PRIORITY

This application is a divisional of U.S. application Ser. No. 13/743,882, filed Jan. 17, 2013, which is divisional of U.S. application Ser. No. 12/894,218 filed on Sep. 30, 2010, which is herein incorporated by reference in its entirety.

BACKGROUND

The present invention relates to integrated circuits, and more specifically, to through-silicon vias (TSVs) formed through an n+ epitaxy layer which reduces parasitic capacitance.

Figure 1:
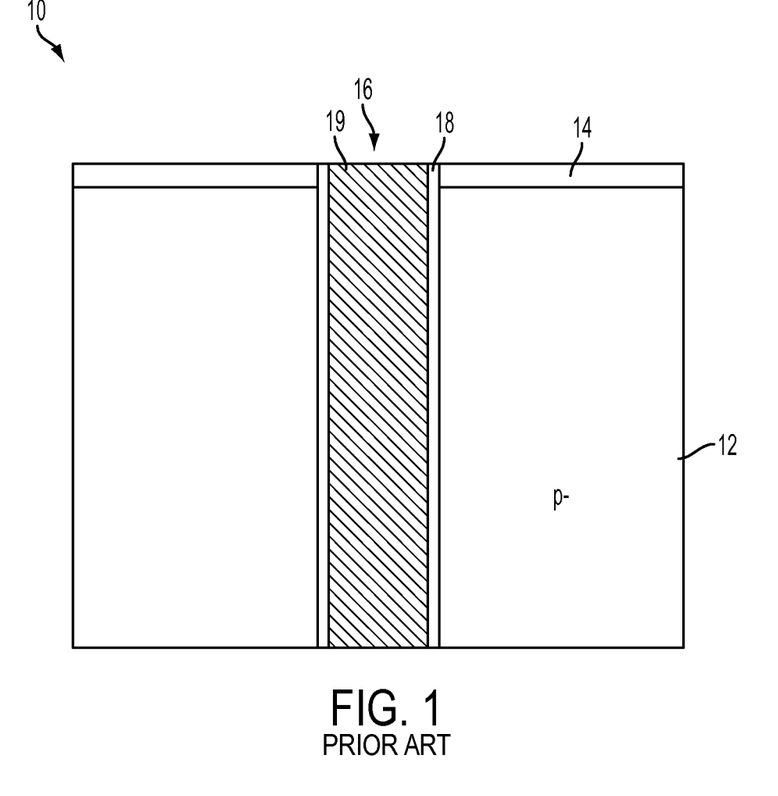
FIG. 1 is a diagram illustrating an example of a through-silicon via for a semiconductor device in the conventional art.

In integrated circuit technology, TSVs are used to create a vertical electrical connection (e.g., a via) passing completely through a silicon wafer or die, and can be used to connect integrated circuits together. FIG. 1 is an example of a TSV in a semiconductor device in the conventional art. As shown in FIG. 1, a semiconductor device 10 includes a semiconductor substrate 12 formed of a low dopant concentration (e.g., a p− layer) and having a device layer 14 formed on a top surface thereof. A trench 16 is etched through the substrate 12 to form a TSV and a dielectric layer 18 is deposited within the trench 16 to form a liner along sidewalls surfaces of the trench 16 for isolation purposes. The trench 16 is then filled with a conductive layer to form a TSV conductor 19.

Figure 2:
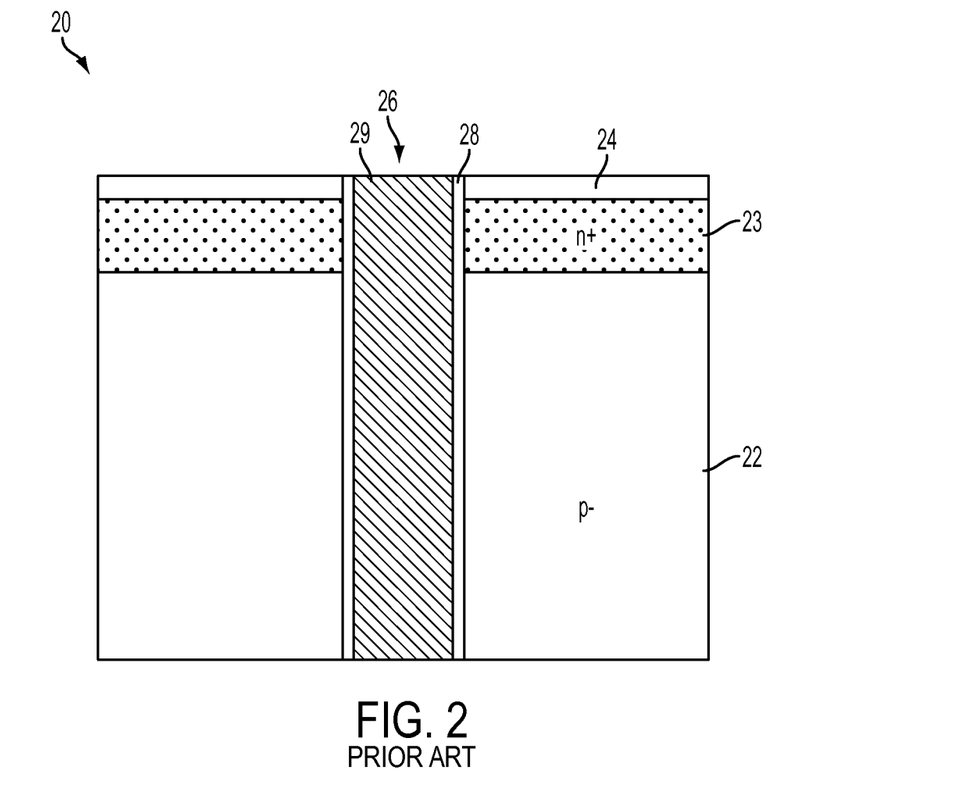
FIG. 2 is a diagram illustrating another example of a through-silicon via for a semiconductor device including an n+ epitaxy layer in the conventional art.

FIG. 2 is another example of a TSV in a semiconductor device in the conventional art. As shown in FIG. 2, the semiconductor device 20 includes a semiconductor substrate 22 having an n+ epitaxy layer 23 formed thereon and a device layer 24 formed on the n+ epitaxy layer 23. A trench 26 is etched through the substrate 22 and a dielectric layer 18 is deposited within the trench 26 to form a liner along sidewall surfaces of the trench 26. The trench 26 is then filled with a conductive layer to form a TSV conductor 29.

Figure 3:
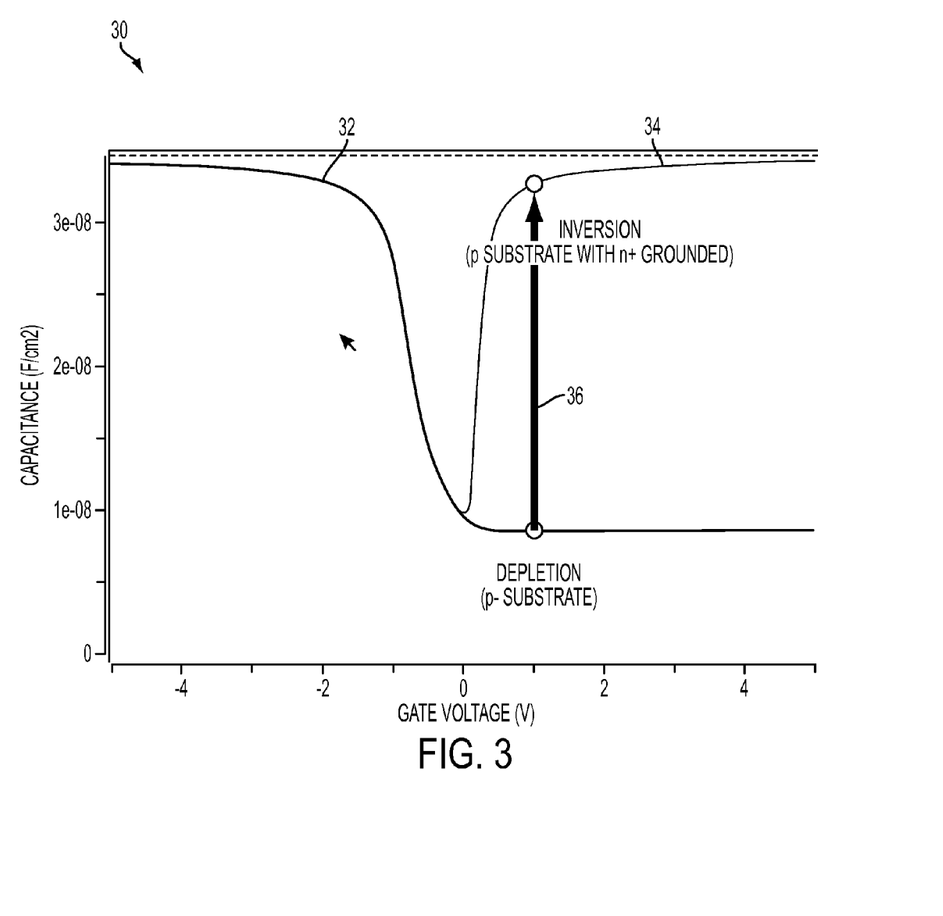
FIG. 3 is a graph illustrating capacitance vs. gate voltage regarding the through-silicon vias shown in FIGS. 1 and 2.

In both examples shown in FIGS. 1 and 2, a MOS (metal oxide semiconductor) capacitor is formed. There may be several problems associated with the MOS capacitors when a n+ epitaxy layer is included as shown in FIG. 2. One of the problems includes capacitance issues. FIG. 3 is a diagram illustrating capacitance vs. gate voltage regarding the TSVs shown in FIGS. 1 and 2. As shown in FIG. 3, for voltages placed on the TSV conductor 19 (as represented by line 32) such as zero or a positive voltage, the capacitance per unit area is very low for example, approximately $1 \times 10^{-8}$ F/cm$^2$. On the other hand, when voltage is placed on the TSV conductor 29 (as represented by line 34), there is a significant increase in the capacitance with the inversion (as represented by arrow 36). Furthermore, when the TSV capacitor operates in the inversion mode, it introduces significant voltage and frequency dependence that thus complicates the TSV modeling.

In eDRAM (i.e., embedded capacitor-based dynamic random access memory) technology, it is necessary to have the n+ epitaxy layer but when combined with the TSV, capacitance significantly increases as shown in FIG. 3.

SUMMARY

According to one embodiment of the present invention, a semiconductor device is provided. The semiconductor device includes an epitaxy layer formed on semiconductor substrate, a device layer is formed on the epitaxy layer, a trench formed within the semiconductor substrate and including a dielectric layer forming a liner within the trench and a conductive core forming a through-silicon via conductor, and a deep trench isolation structure formed within the substrate and surrounding the through-silicon via conductor. A region of the epitaxy layer formed between the through-silicon via conductor and the deep trench isolation structure is electrically isolated from any signals applied to the semiconductor device, thereby decreasing parasitic capacitance.

According to another embodiment of the present invention, a semiconductor device is provided. The semiconductor device includes an epitaxy layer formed on a semiconductor substrate, a device layer is formed on the epitaxy layer, a trench formed within the semiconductor substrate and including a dielectric layer forming a liner within the trench and a conductive core forming a through-silicon via conductor, and a grounded through-silicon via formed within the substrate and surrounding the through-silicon via conductor. A region of the epitaxy layer formed between the through-silicon via conductor and the grounded through-silicon via is electrically isolated from any signals applied to the semiconductor device.

According to another embodiment of the present invention, a semiconductor device is provided. The semiconductor device includes a p-doped layer formed on a semiconductor substrate and comprising a higher dopant concentration than that of the semiconductor substrate, an epitaxy layer formed on the p-doped layer, a device layer formed on the epitaxy layer, and a trench formed within the semiconductor substrate and including a dielectric layer forming a liner within the trench and a conductive core forming a through-silicon via conductor.

According to another embodiment of the present invention, a semiconductor device is provided. The semiconductor device includes an epitaxy layer formed on a semiconductor substrate, a device layer 44 is formed on the epitaxy layer, a trench formed within the semiconductor substrate and including a dielectric layer forming a liner within the trench and a conductive core forming a through-silicon via conductor, and a p-doped region implanted beneath the epitaxy layer and adjacent to the through-silicon via conductor and the semiconductor substrate and comprising a higher dopant concentration than that of the semiconductor substrate.

According to another embodiment of the present invention, a method is provided. The method includes forming an epitaxy layer on a semiconductor substrate, forming a trench having a dielectric liner and conductive core within the trench to form a through-silicon via conductor, and implanting a p-doped region beneath the epitaxy layer and adjacent to the through-silicon via conductor.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

Figure 4:
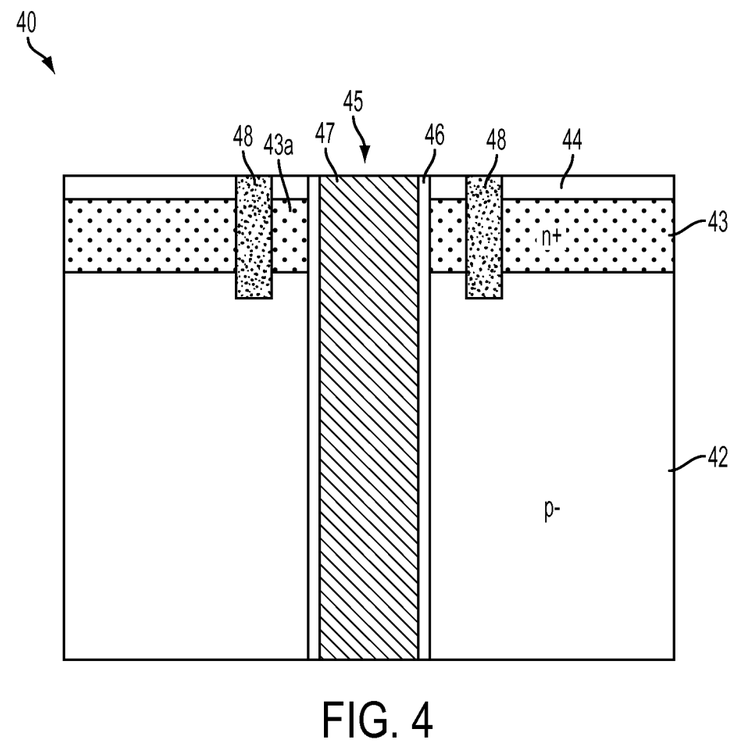
FIG. 4 is a diagram illustrating a through-silicon via and a deep trench isolation structure for a semiconductor device that can be implemented within embodiments of the present invention.

It is desirable to have an n+ epitaxy layer within an eDRAM, without the increased parasitic capacitance for the through-silicon-via (TSV) structures. Embodiments of the present invention provide semiconductor devices including n+ epitaxy layers and alternative ways for reducing the TSV capacitance. FIG. 4 is a diagram illustrating a through-silicon via and a deep trench isolation structure for a semiconductor device that can be implemented within embodiments of the present invention. As shown in FIG. 4, a semiconductor device 40 is provided. A semiconductor substrate 42 is formed. The semiconductor substrate 42 is formed of a low dopant concentration (e.g., a p− layer). The semiconductor substrate 42 may be formed of silicon (Si), but is not limited hereto and may be formed of any semiconductor material. An epitaxy layer 43 (e.g., an n+ epitaxy layer) is formed on the semiconductor substrate 42 and a device layer 44 is formed on the epitaxy layer 43. According to an embodiment of the present invention, the n+ epitaxy layer 43 is formed of a predetermined thickness usually ranging from approximately 1 micrometer to approximately 10 micrometers. Further, the n+ epitaxy layer 43 has a doping level above approximately $1 \times 10^{19}$ atoms/cm$^3$.

A through-silicon via (TSV) is also formed within the semiconductor substrate 42. As shown in FIG. 4, a trench 45 is etched through the substrate 42 using a reactive ion etch (RIE) process, for example. According to an embodiment of the present invention, the trench 45 is between approximately 2 micrometers and approximately 10 micrometers in diameter and a depth in the range of approximately 20 micrometer to 50 micrometers.

The trench 45 is then lined with a dielectric layer 46 for isolation purposes. According to an embodiment of the present invention, the dielectric layer 46 may be formed of silicon dioxide (SiO$_2$) or silicon nitride (SiN), for example, and may have a thickness of between approximately 50 nanometers (nm) to approximately 100 nanometers (nm). The trench 45 is then filled with an electrically conductive material such as copper or tungsten, for example, to thereby form a TSV conductor 47. Depending on the requirements of the process flow, the formation and filling of the trench can be performed before or after other devices are formed as known in the art. According to this embodiment of the present invention, a deep trench isolation structure 48 surrounds the TSV conductor 47. That is, the deep trench isolation structure 48 is formed as a ring around the TSV conductor 47. As shown in FIG. 4, region 43a of the n+ epitaxy layer between the deep trench isolation structure 48 and the TSV conductor 47 is electrically isolated from any signals applied to the semiconductor device 40, therefore the TSV capacitance cannot go to inversion mode since there is no source to supply minority carriers (i.e., electrons). Hence, at high frequencies e.g., above approximately 10 kHz and thus for any practical purpose the TSV capacitance operates in the depletion mode and not inversion mode. Further, the region 43a of the epitaxy layer 43 is formed of a predetermined thickness ranging from approximately 1 micrometer to approximately 10 micrometers. The present invention is not limited to the use of a deep trench isolation structure as shown in FIG. 4 to reduce parasitic capacitance. Other embodiments of the present invention will now be described below with reference to FIGS. 5 through 8.

Figure 5:
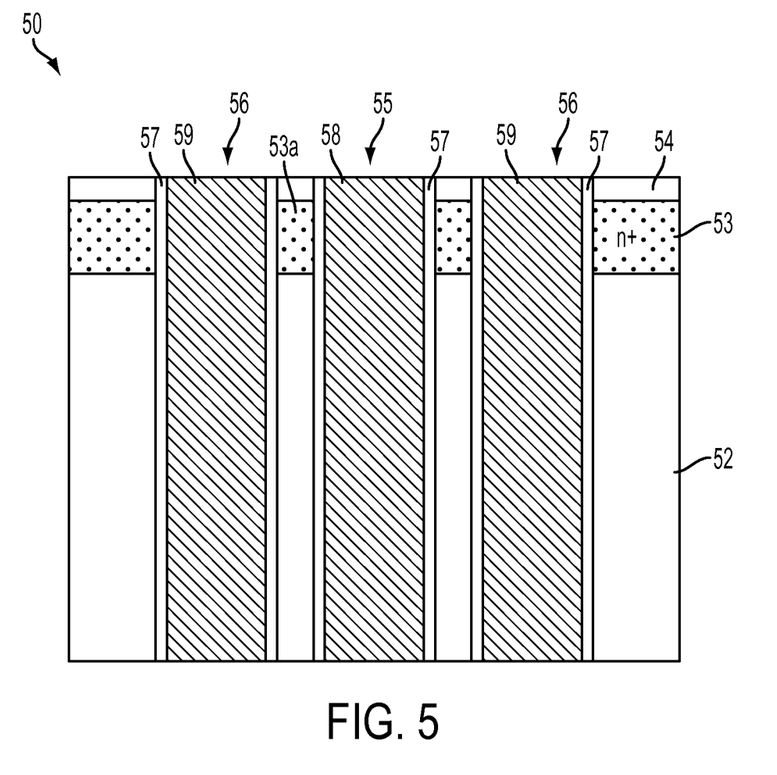
FIG. 5 is a diagram illustrating a through-silicon via and a grounded through-silicon via for a semiconductor device that can be implemented within alternative embodiments of the present invention.

FIG. 5 is a diagram illustrating a through-silicon via and an isolating through-silicon via for a semiconductor device 50 that can be implemented within alternative embodiments of the present invention. As shown in FIG. 5, a semiconductor substrate 52 is formed. An n+ epitaxy layer 53 is formed on the semiconductor substrate 52. A device layer 54 is then formed on the n+ epitaxy layer 53. A plurality of trenches 55 and 56 are etched within the semiconductor substrate 52 using an etching process. These trenches 55 and 56 are then lined with a dielectric layer 57. The trench 55 is filled with an electrically conductive material to form a signal TSV 58. The trench 56 is also filled with the conductive material and used to form an isolating TSV 59 surrounding the TSV conductor 58. Therefore, similar to FIG. 4, a region 53a of the n+ epitaxy layer 53 between the isolating TSV 59 and the signal TSV 58 is electrically isolated to prevent the TSV capacitance from going to inversion mode. According to an embodiment of the present invention, the region 53a of the n+ epitaxy layer 53 is formed of a predetermined thickness ranging from approximately 1 micrometer to approximately 10 micrometers. The isolating TSV 59 is preferably grounded to reduce the noise coupling between different devices and signal TSV 58. However, it can be kept floating if desired. As shown in FIG. 5, according to an embodiment of the present invention, the isolating TSV 59 is of a length and width comparable to that the signal TSV 58. However, the present invention is not limited to the isolating TSV 59 being of a particular length or width. An alternative embodiment of the isolating TSV 59 will now be discussed with reference to FIG. 6.

Figure 6:
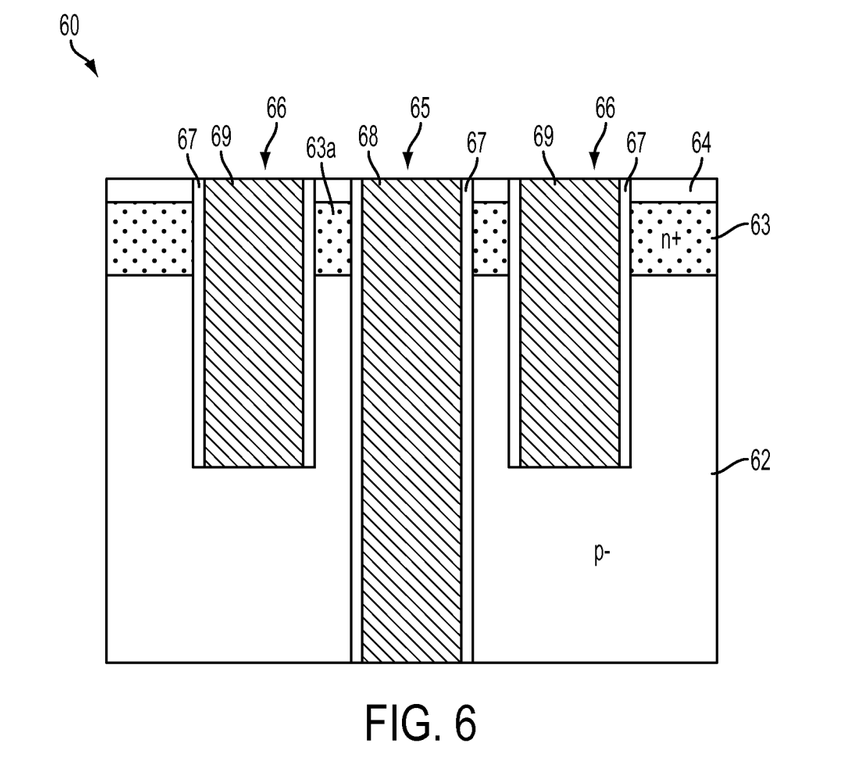
FIG. 6 is a diagram illustrating a through-silicon via and a grounded through-silicon via for a semiconductor device that can be implemented within alternative embodiments of the present invention.

FIG. 6 is a diagram illustrating a through-silicon via and an isolating through-silicon via for a semiconductor device 60 that can be implemented within alternative embodiments of the present invention. As shown in FIG. 6, a semiconductor substrate 62 is provided. An n+ epitaxy layer 63 is formed on the semiconductor substrate 62. A device layer 64 is then formed on the n+ epitaxy layer 63. A plurality of trenches 65 and 66 are etched through the semiconductor substrate 62 using an etching process. According to an embodiment of the present invention, the trench 66 is etched narrower than that of the trench 65 and is thus has less depth due to loading effect in the etch process A dielectric liner 67 is then formed within each trench 65 and 66. An electrically conductive material is then deposited within the trench 65 to form a signal TSV 68. An isolating TSV 69 is formed within the trench 66. The isolating TSV 69 has the same effect as that shown in FIG. 5. That is, a region 63a of the n+ epitaxy layer 63 is electrically isolated to prevent an increase in parasitic capacitance when voltage is applied to the signal TSV 68. Since the isolating 69 (in FIG. 6) is made narrower than the isolating TSV 59 (in FIG. 7) it adds less area penalty. Yet, it has similar effect in preventing the TSV capacitance from operating in the inversion mode and thus reduces the parasitic capacitance.

Figure 7:
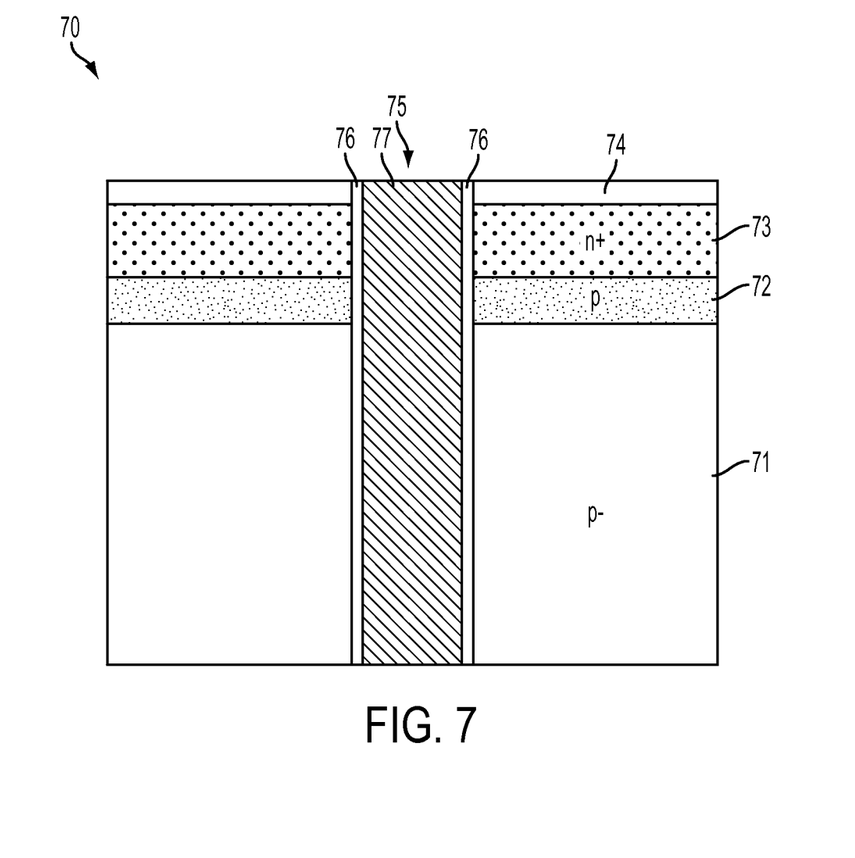
FIG. 7 is a diagram illustrating a through-silicon via and a p-doped layer formed beneath the n+ epitaxy layer in a semiconductor device that can be implemented within alternative embodiments of the present invention.
Figure 11:
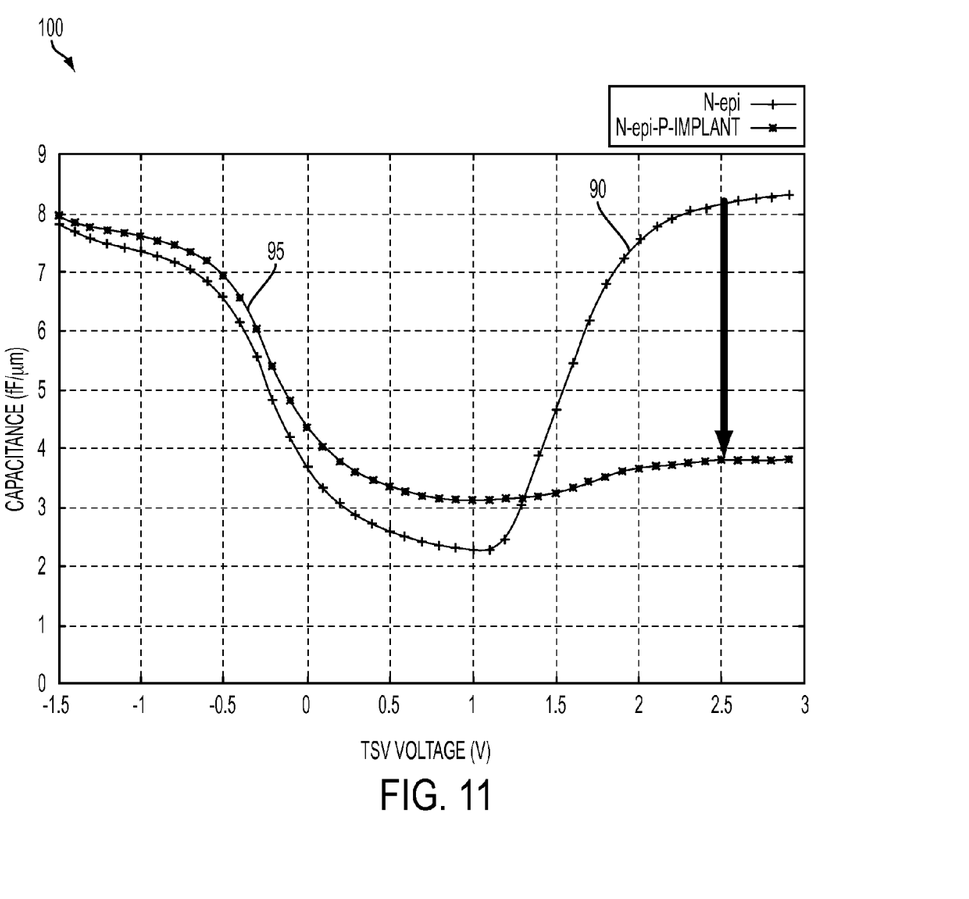
FIG. 11 is a graph illustrating capacitance vs. gate voltage regarding the through-silicon vias implemented within embodiments of the present invention.

FIG. 7 is a diagram illustrating a through-silicon via and a p-doped layer formed beneath the n+ epitaxy layer in a semiconductor device 70 that can be implemented within alternative embodiments of the present invention. As shown in FIG. 7, a semiconductor substrate 71 formed of a low dopant concentration (e.g., a p− layer) is provided. A p-doped layer 72 formed on the semiconductor substrate 71. An n+ epitaxy layer 73 is formed on the p-doped layer 72 and a device layer 74 is formed on the n+ epitaxy layer 73. A through-silicon via is formed within the semiconductor substrate 71. The through-silicon via is formed by etching a trench 75 through the semiconductor substrate 71 and depositing a dielectric layer 76 to form a liner on the sidewalls within the trench 75. The trench 75 is then filled with an electrically conductive material to form a through-silicon via conductor 77. According to an embodiment of the present invention, the p-doped layer 72 is formed without been deactivated by the n+ diffusion. Further, the p-doped layer 72 is formed of a higher dopant concentration than the semiconductor substrate 71, thereby increasing a threshold voltage of the semiconductor device and decreasing the parasitic capacitance (as depicted in FIG. 11 (line 95)). According to an embodiment of the present invention, the p-doped layer 72 is of a predetermined width ranging from approximately 200 nanometer to approximately 2 micrometer and includes a doping concentration of $1\times10^{18}$ atoms/$cm^3$ or greater. According to an embodiment of the present invention, it is not necessary for the p-doped layer to be formed over the entire surface of the semiconductor substrate in order to increase the threshold voltage. An alternative embodiment will now be discussed below with reference to FIG. 8.

Figure 8:
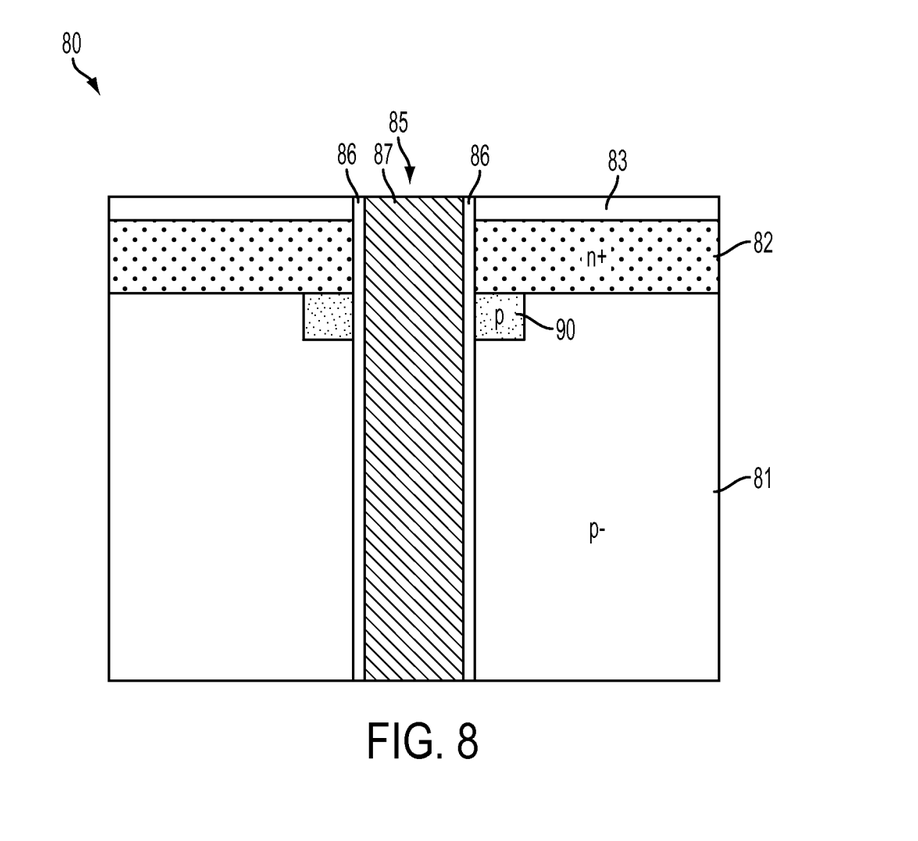
FIG. 8 is a diagram illustrating a through-silicon via and an implanted p-doped region beneath the n+ epitaxy layer and adjacent to the through-silicon via in a semiconductor device that can be implemented within alternative embodiments of the present invention.

FIG. 8 is a diagram illustrating a through-silicon via and an implanted p-doped region beneath the n+ layer and adjacent to the through-silicon via in a semiconductor device 80 that can be implemented within alternative embodiments of the present invention. As shown in FIG. 8, a semiconductor substrate 81 is provided. The semiconductor substrate is formed of a low dopant concentration. An n+ epitaxy layer 82 is formed on the semiconductor substrate 81 and a device layer 83 is formed on the n+ epitaxy layer. A through-silicon via is then formed by etching a trench 85 through the semiconductor substrate 81 and depositing a dielectric layer 86 to form a liner on sidewalls surfaces within the trench 85. The trench 85 is then filled with an electrically conductive material to form a through-silicon via conductor 87. A p-doped region 90 implanted beneath the n+ epitaxy layer and adjacent to the through-silicon via conductor 87 and formed of a higher dopant concentration than that of the semiconductor substrate 81, to increase threshold voltage of the semiconductor device and in turn lower the parasitic capacitance. According to an embodiment of the present invention, p-doped region 90 is of a predetermined width ranging from approximately 200 nanometer to approximately 2 micrometer and includes a doping concentration of $1\times10^{18}$ atoms/$cm^3$ or greater. Methods for implanting the p-doped region 90 will be discussed below with reference to FIGS. 9 and 10.

Figure 9:
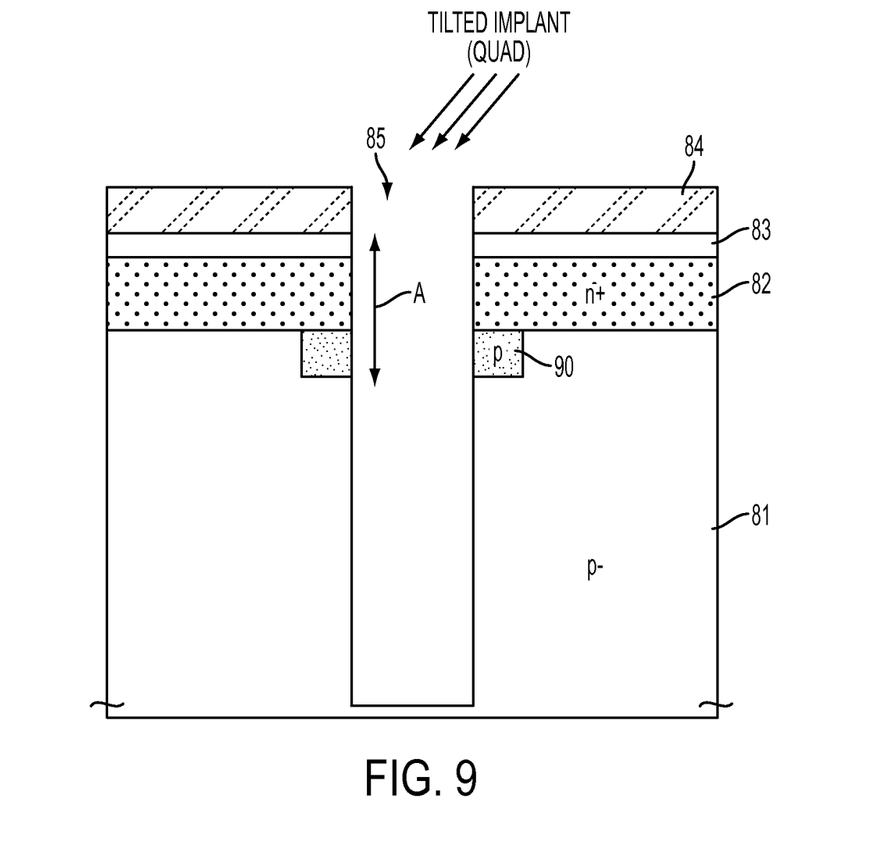
FIG. 9 is a diagram illustrating a method of implanting the p-doped region beneath the n+ epitaxy layer and adjacent to the through-silicon via as shown in FIG. 8 that can be implemented within embodiments of the present invention.
Figure 10:
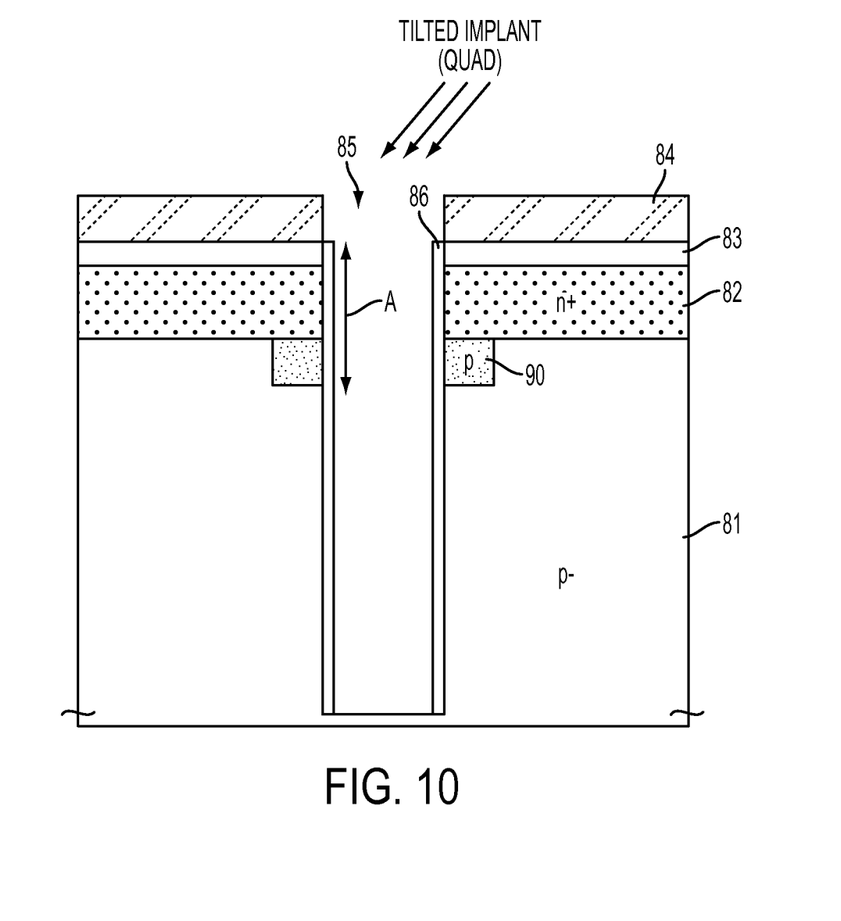
FIG. 10 is a diagram illustrating a method of implanting the p-doped region beneath the n+ epitaxy layer and adjacent to the through-silicon via as shown in FIG. 8 that can be implemented within alternative embodiments of the present invention.

As shown in FIGS. 9 and 10, the p-doped region 90 is formed by forming a photo resist layer 84 on the device layer and performing angled implantation of p-dopants after the trench 85 is formed. The implantation is performed from various angles, at least four different angles (the so-called "quad" implant), for example, 0°, 90°, 180°, and 270°. Other "quad" implant direction, such as 45°, 135°, 225°, 315° can be also used. The implantation of the p dopants is formed at a predetermined implantation depth 'A' just beneath the n+ epitaxy layer 82 by proper tilting of the implant. According to an embodiment of the present invention, the p dopants may comprise boron (B) or indium (In), for example. In FIG. 9, the implantation of p-dopants is performed prior to depositing the dielectric layer 86 within the trench 85. In FIG. 10, the implantation of p-dopants is performed after depositing the dielectric layer 86 within the trench 85. In both cases a "diffusion-less" process is used to activate the p doping without causing significant diffusion of the n+ doping from the n+ epitaxy layer 82 into the p-doped region. This can be done by annealing at low temperatures so that the n+ dopants do not diffuse or by a laser annealing, for example.

FIG. 11 is a graph 100 illustrating capacitance vs. gate voltage regarding the through-silicon vias implemented within embodiments of the present invention. As shown in FIG. 11, and discussed above with reference to FIG. 2, the semiconductor device having an n+ epitaxy layer shows increased parasitic capacitance (as indicated by line 90). The use of an n+ epitaxy and a p doped layer or region adjacent to the through-silicon via and having a dopant concentration higher than that of the semiconductor substrate increasing the threshold voltage while decreasing the parasitic capacitance.

Thus, embodiments of the present invention provide a way to use n+ epitaxy layer within eDRAM technology, for example, while reducing parasitic capacitance. By preventing the TSV capacitance from operating in the inversion mode, these embodiments also remove the voltage and frequency dependency of the TSV capacitance and simplify the device modeling.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one ore more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A method comprising:
   forming an n+ epitaxy layer on top of a p-doped semiconductor substrate;
   forming a device layer on the epitaxy layer;
   forming a trench having a dielectric liner and conductive core within the trench to form a through-silicon via conductor, such that the trench extends through the epitaxy layer and the p-doped semiconductor substrate; and
   implanting a p-doped region within the p-doped semiconductor substrate in contact with the p-doped semiconductor substrate and n+ epitaxy layer, beneath the epitaxy layer and adjacent to the through-silicon via conductor, wherein the p-doped region is formed of a higher dopant concentration that of the p-doped semiconductor substrate.

2. The method of claim 1, wherein, the p-doped region is formed by performing angled implantation p-dopants.

3. The method of claim 2, wherein the p dopants comprise boron (B) or Iridium (In).

4. The method of claim 2, wherein the angled implantation is performed after the trench is formed and prior to forming the dielectric liner within the trench.

5. The method of claim 2, wherein the angled implantation is performed after the trench and the dielectric liner are formed, such that the implantation is performed through the dielectric liner.

6. The method of claim 2, wherein the angled implantation is performed from at least four different angles.

7. The method of claim 2, further comprising:
   forming a photoresist layer on the device layer; and
   performing the angled implantation after forming the photoresist layer on the device layer.

8. The method of claim 2, further comprising annealing the p-doped region in order to activate the p-doped region after performing the angled implantation.

9. The method of claim 8, wherein the annealing comprises low temperature annealing at a temperature selected such that n dopants in the epitaxy layer are not diffused into the p-doped region.

10. The method of claim 8, wherein the annealing comprises laser annealing.

* * * * *